United States Patent
Kim et al.

(10) Patent No.: US 6,483,353 B2
(45) Date of Patent: Nov. 19, 2002

(54) CURRENT SENSE AMPLIFIER CIRCUITS CONTAINING LATCHES FOR IMPROVING STABILITY AND AMPLIFICATION IN SEMICONDUCTOR DEVICES

(75) Inventors: Joung-yeal Kim, Kyungki-do (KR); Chul-soo Kim, Kyungki-do (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 09/999,650

(22) Filed: Oct. 30, 2001

(65) Prior Publication Data

US 2002/0050843 A1 May 2, 2002

(30) Foreign Application Priority Data

Oct. 31, 2000 (KR) ........................................ 2000-64218

(51) Int. Cl.[7] .............................................. G01R 19/00
(52) U.S. Cl. ........................................... 327/55; 327/57
(58) Field of Search ............................. 327/51, 52, 55, 327/56, 57, 64, 65, 76, 78–83, 85, 88, 89, 90; 365/205–208

(56) References Cited

U.S. PATENT DOCUMENTS

| | | | | | |
|---|---|---|---|---|---|
| 5,619,467 | A | * | 4/1997 | Sim | 327/52 |
| 5,796,273 | A | * | 8/1998 | Jung et al. | 327/55 |
| 6,081,138 | A | * | 6/2000 | Kusaba | 327/55 |
| 6,281,713 | B1 | * | 8/2001 | Kim | 327/55 |
| 6,333,647 | B1 | * | 12/2001 | Plagens | 327/198 |
| 6,356,120 | B1 | * | 3/2002 | Graetz | 327/55 |

FOREIGN PATENT DOCUMENTS

JP  8-287680  11/1996

* cited by examiner

*Primary Examiner*—My-Trang Nu Ton
(74) *Attorney, Agent, or Firm*—Myers Bigel Sibley & Sajovec

(57) ABSTRACT

The present invention provides a current sense amplifier including first and second sense transistors having cross-coupled gates and drains. The current sense amplifier further includes first and second load devices having first terminals connected to respective drains of the first and second sense transistors and a latch having first and second inputs connected to respective drains of the first and second sense transistors. The amplifier still further includes an enable device that is responsive to an enable signal and has a first terminal connected to second terminals of the first and second load devices and a first output of the latch.

34 Claims, 4 Drawing Sheets

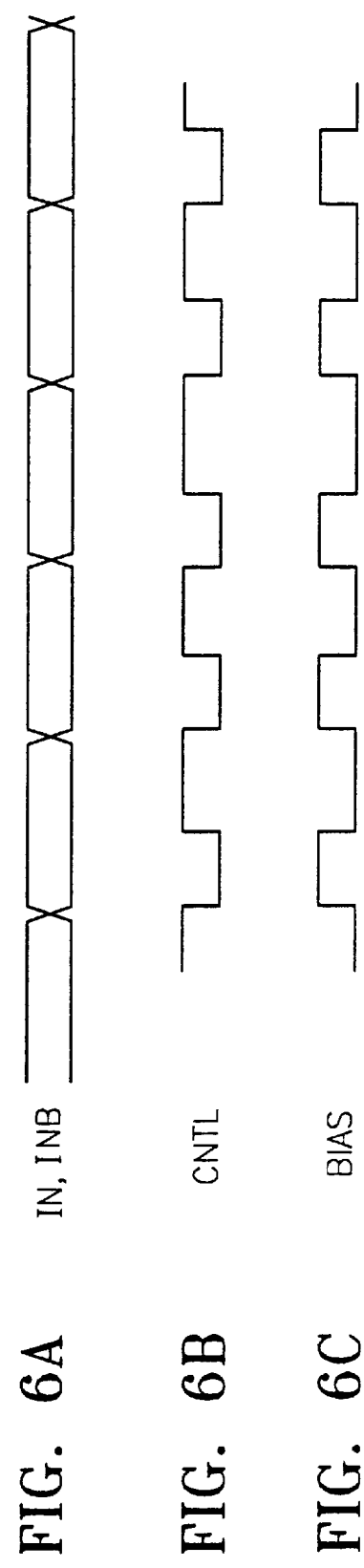

CURRENT SENSE AMPLIFIER CIRCUITS CONTAINING LATCHES FOR IMPROVING STABILITY AND AMPLIFICATION IN SEMICONDUCTOR DEVICES

RELATED APPLICATION

This application is related to Korean Application No. 2000-64218, filed Oct. 31, 2000, the disclosure of which is hereby incorporated herein by reference.

FIELD OF THE INVENTION

The present invention relates to semiconductor devices and, more particularly, to semiconductor devices that improve stability and amplification in semiconductor memory devices.

BACKGROUND OF THE INVENTION

Voltage sense amplifiers and/or current sense amplifiers are typically used to output data in semiconductor memory devices. Current sense amplifiers may be used more often because they may provide faster sensing speeds. A current sense amplifier typically receives current on a pair of input lines, amplifies the current as a voltage signal and outputs the amplified signal. The current sense amplifier uses a positive feedback circuit to provide an accurate current. These conventional current sense amplifiers may cause instability in the semiconductor device, such as oscillation of an output voltage.

Referring to FIG. 1, a detailed circuit diagram of conventional current sense amplifier circuits having a positive feedback circuit will be described. The current sense amplifier circuit consists of PMOS transistors MP11 and MP12 for sensing a current, NMOS transistors MN11 and MN12 for acting as a load resistance, and a switching transistor MN13. Currents I1 and I2 received over a pair of differential input/output lines IO and IOB (not shown) are input to input terminals IN and INB. PMOS transistors MP11 and MP12 are connected in a latch structure, i.e. the gates and drains of PMOS transistors MP11 and MP12 are cross coupled, and the drains of the PMOS transistors MP11 and MP12 are connected to an output terminal OUT and a complementary output terminal OUTB, respectively. The NMOS transistors MN11 and MN12 may be formed of diode-type transistors and may have the same resistance values. The switching transistor MN13 is switched by an enable signal and allows the predetermined currents I1 and I2 supplied from the pair of differential input/output lines IO and IOB (not shown) to be directed to a ground voltage VSS.

It will be understood that in conventional current sense amplifiers, for example, the current sense amplifier of FIG. 1, it may be difficult to maintain and/or improve stability and amplification of the semiconductor device while effectively sensing the current of the semiconductor device. For example, in the case of the PMOS transistors MP11 and MP12, a current difference ΔI may be obtained using the following equations:

$$I1 = -g_{mp} * v_{outb} \quad (1)$$

$$I2 = -g_{mp} * v_{out} \quad (2)$$

$$\Delta I = I1 - I2 = g_{mp}(v_{out} - v_{outb}) \quad (3)$$

where I1 and I2 represent predetermined currents supplied from the pair of differential input/output lines IO and IOB, respectively, $g_{mp}$ represents the transconductance of PMOS transistors MP11 and MP12, $v_{out}$ represents the output voltage of output terminal OUT, $v_{outb}$ represents the output voltage of complementary output terminal OUTB, and ΔI represents the difference between first and second currents I1 and I2, respectively.

Furthermore, in the case of NMOS transistors MN11 and MN12, a current difference ΔI may be obtained using the following equations:

$$I1 = g_{mn} * v_{out} \quad (4)$$

$$I2 = g_{mn} * v_{outb} \quad (5)$$

$$\Delta I = I1 - I2 = g_{mn}(v_{out} - v_{outb}) \quad (6)$$

where I1 and I2 represent predetermined currents supplied from the pair of differential input/output lines IO and IOB, respectively, $g_{mn}$ represents the transconductance of NMOS transistors MN11 and MN12, $v_{out}$ represents the output voltage of output terminal OUT, $v_{outb}$ represents the output voltage of complementary output terminal OUTB, and ΔI represents the difference between first and second currents I1 and I2.

Typically, the voltages and currents of NMOS transistors MN11 and MN12 and PMOS transistors MP11 and MP12 are the same, thus, $g_{mp}$ is typically equal to $g_{mn}$. However, when $g_{mp}$ is larger than $g_{mn}$, PMOS transistors MP11 and MP12 may amplify a larger current difference than the original current difference ΔI, thus, reversing the voltages of the input terminals IN and INB. This may cause the voltages and currents of PMOS transistors MP11 and MP12 to be unstable. Thus, with respect to maintaining stability of the semiconductor device, $g_{mn}$ is preferably larger than $g_{mp}$. On the other hand, when $g_{mn}$ is larger than $g_{mp}$ the current sense amplifier circuit may be less efficient and this may cause the sensing speed of the semiconductor device to deteriorate. Thus, a trade-off exists between stability of the semiconductor device and sensing speed of the semiconductor device and the transconductances $g_{mn}$ and $g_{mp}$ should be chosen accordingly. The modulation effects of a PMOS channel length is typically larger than the modulation effects of an NMOS channel length, thus, the larger a power supply voltage, the larger the transconductance $g_{mp}$ of the PMOS transistors MP11 and MP12.

Now referring to FIG. 2, a diagram illustrating the current and/or voltage characteristics of transistors in conventional current sense amplifier circuits, for example, as shown in FIG. 1, will be described. Voltages $V_{gsn}$ and $V_{gsp}$ between the gates and the sources of the NMOS transistors and the PMOS transistors are illustrated on the horizontal axis, and the drain currents $I_{dn}$ and $I_{dp}$ of each of the NMOS and PMOS transistors are illustrated on the vertical axis. As illustrated, when the voltages $V_{gsn}$ and $V_{gsp}$ are larger than a predetermined voltage $V_c$, the slope of a curve of current and/or voltage characteristics of the PMOS transistors MP11 and MP12 is larger than the slope of a curve of current and/or voltage characteristics of the NMOS transistors MN11 and MN12. In this situation the transconductance $g_{mp}$ of the PMOS transistors is larger than the transconductance $g_{mn}$ of the NMOS transistors, and thus, the stability of the current sense amplifier circuit may deteriorate. Furthermore, as the power supply voltage increases, the stability of the current sense amplifier circuit continues to deteriorate, which may result in the inability to increase the amplification of an operation voltage. Consequently, the operation speed of a conventional current sense amplifier circuit may be slow and may be sensitive to noise.

SUMMARY OF THE INVENTION

Embodiments of the present invention provide a current sense amplifier including first and second sense transistors having cross-coupled gates and drains. The current sense amplifier further includes first and second load devices having first terminals connected to respective drains of the first and second sense transistors and a latch having first and second inputs connected to respective drains of the first and second sense transistors. The amplifier still further includes an enable device that is responsive to an enable signal and has a first terminal connected to second terminals of the first and second load devices and a first output of the latch.

In other embodiments of the present invention the first and second load devices may include first and second load transistors, respectively, that are connected as diodes. The latch may include first and second MOS transistors having crosscoupled drain and gates and may be responsive to a bias signal. The bias signal may be generated by a bias circuit that generates the bias signal on an output signal line in response to a control signal.

In further embodiments of the present invention, the bias circuit may include a first PMOS transistor having a source connected to a power supply voltage and a gate and a drain connected together. The circuit may further include a first NMOS transistor responsive to the control signal having a drain connected to the gate and drain of the first PMOS transistor and a source connected to the output signal line and second and third NMOS transistors connected in a totem pole arrangement between the output signal line and a ground voltage and having cross coupled gates and drains in a diode structure. The circuit may still further include a fourth NMOS transistor having a gate connected to the control signal, a drain connected to the output signal line and a source connected to the ground voltage.

In still further embodiments of the present invention, the control signal may be generated in response to a column selection signal and a latch instruction signal that indicates the time of the latch. The bias signal may be a logic high when the control signal is a logic low and the bias signal may be a logic low when the control signal is a logic high. The latch may be activated when the bias signal is at a logic high and may be deactivated when the bias signal is at a logic low. The control signal may be a logic low when a pair of first and second output voltages vary. The control signal may be a logic high when the first and second output signals are constant and have different values. The control signal may be a logic high when a power supply voltage is increased beyond a predetermined level.

BRIEF DESCRIPTION OF THE DRAWINGS

FIGS. 6(A) through 6(C) are timing diagrams illustrating operations of current sense amplifiers according to embodiments of the present invention, for example, the circuit shown in FIG. 5.

DETAILED DESCRIPTION OF THE INVENTION

The present invention now will be described more fully hereinafter with reference to the accompanying drawings, in which preferred embodiments of the invention are shown. This invention may, however, be embodied in many different forms and should not be construed as limited to the embodiments set forth herein; rather these embodiments are provided so that this disclosure will be thorough and complete, and will fully convey the scope of the invention to those skilled in the art. It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers refer to like elements throughout.

Embodiments of the present invention will now be described in detail below with reference to FIGS. 1 through 6, which illustrate various embodiments of the present invention. A semiconductor device is provided having a current sense amplifier including a latch responsive to a bias signal. The latch may be turned on and/or off in response to the bias signal. The functionality of the latch may be used to provide a stable semiconductor device and to increase the degree of amplification within the current sense amplifier.

Figure 1:
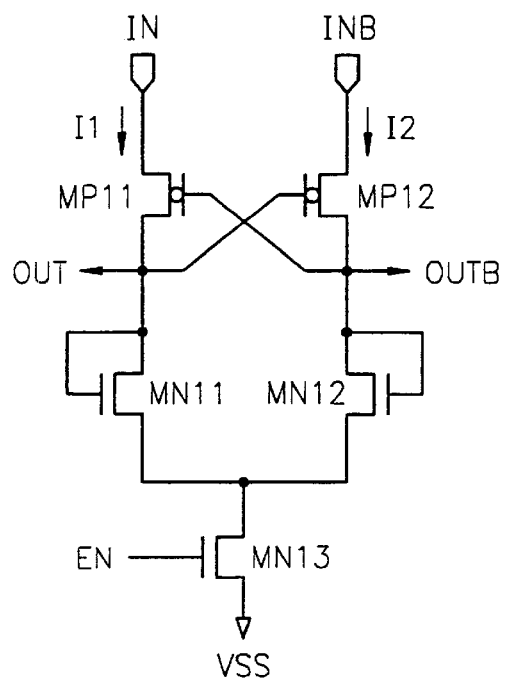
FIG. 1 is a circuit diagram of a conventional current sense amplifier circuit.
Figure 2:
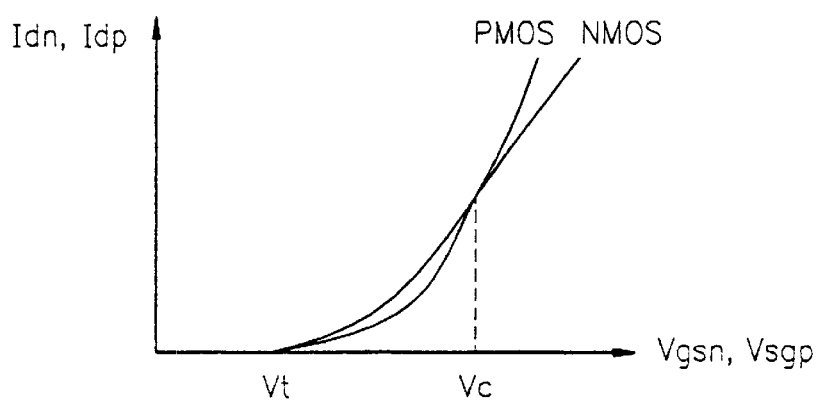
FIG. 2 is a diagram illustrating current and/or voltage characteristics of transistors in conventional current sense amplifiers, for example, the circuit shown in FIG. 1.
Figure 3:
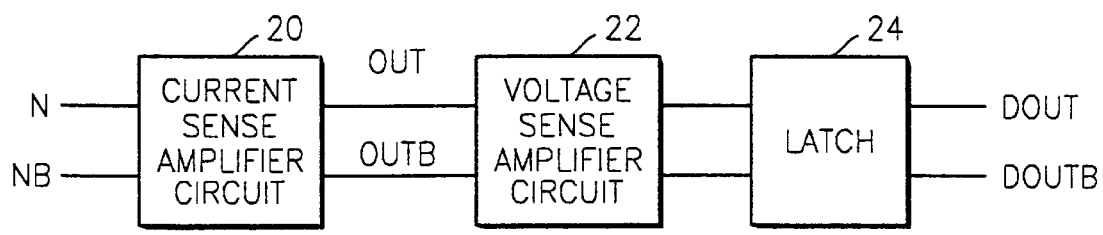
FIG. 3 is a schematic block diagram of an input/output (I/O) sense amplifier circuit in which a current sense amplifier circuit according embodiments of the present invention may be employed.

Now referring to FIG. 3, an input/output (I/O) sense amplifier circuit in which a current sense amplifier circuit according embodiments of the present invention may be employed will be described. An input/output (I/O) sense amplifier may include a current sense amplifier circuit 20, a voltage sense amplifier circuit 22, and a latch 24. The current sense amplifier circuit 20 senses and amplifies currents of a pair of input/output lines IO and IOB (not shown), converts the currents into voltages and outputs them to output terminals OUT and OUTB. The voltage sense amplifier circuit 22 senses and amplifies a difference in the voltages output from the current sense amplifier circuit 20 and outputs the amplified results. The latch 24 latches a signal amplified by the voltage sense amplifier circuit 22 and outputs the latched results to output terminals DOUT and DOUTB.

Figure 4:
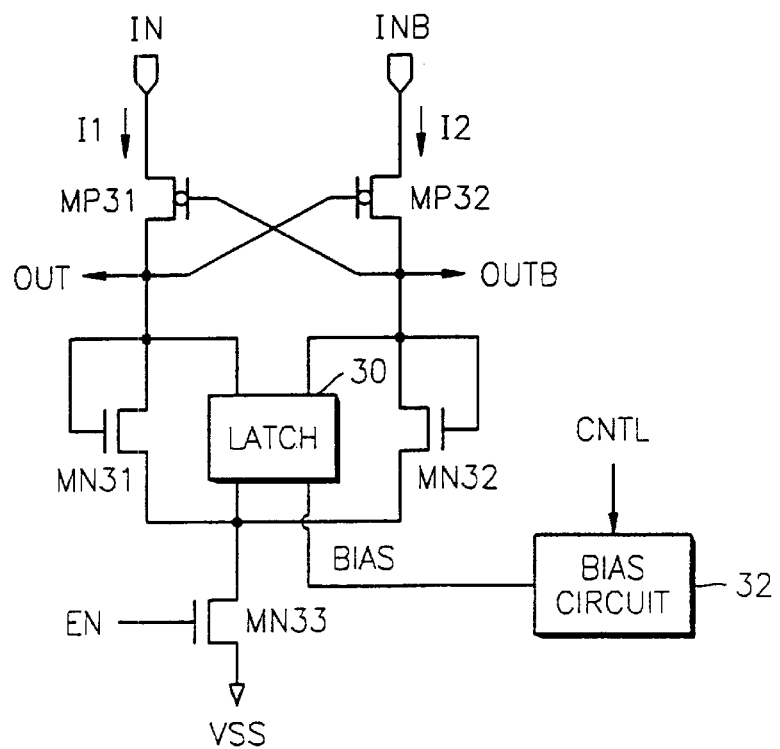
FIG. 4 is a block diagram of a current sense amplifier circuit in a semiconductor memory device according to embodiments of the present invention.

Now referring to FIG. 4, a current sense amplifier circuit according to embodiments of the present invention will be described. The current sense amplifier of FIG. 4 includes PMOS transistors MP31 and MP32, NMOS transistors MN31 and MN32, an NMOS transistor MN33, a latch 30, and a bias circuit 32. Input terminals IN and INB are connected to the sources of the PMOS transistors MP31 and MP32, respectively, and the gates and drains of the PMOS transistors MP31 and MP32 are cross coupled as illustrated in FIG. 4. The PMOS transistors MP31 and MP32 are sense transistors having a latch structure and may sense a difference between input currents I1 and I2. The input terminals IN and INB may be connected to a pair of data input/output lines IO and IOB (not shown). The drains of the PMOS transistors MP31 and MP32 are connected to output terminal OUT and complementary output terminal OUTB, respectively.

The NMOS transistors MN31 and MN32 are load transistors that function as a load resistance. The NMOS transistors MN31 and MN32 are connected in a diode structure, i.e. the gates and drains of NMOS transistors MN31 and MN32 are connected to the drains of the PMOS transistors MP31 and MP32 as illustrated in FIG. 4. Currents I1 and I2 pass through PMOS transistors MP31 and MP32 to NMOS transistors MN31 and MN32. A voltage applied to the load resistance, for example, output voltages $V_{OUT}$ and $V_{OUTB}$ may be varied by currents I1 and I2.

The latch 30 is connected in parallel with the NMOS transistors MN31 and MN32 and forms another current path from the PMOS transistors MP31 and MP32 in response to a bias signal on the output signal line BIAS. The latch 30 may increase and/or decrease output voltages quickly when voltages of the output terminal OUT and the complementary output terminal OUTB begin to be varied, and may simultaneously latch the voltages of the output terminals OUT and OUTB when there is a significant difference between the voltages. The configuration and operation of the latch 30 will be discussed in detail below with respect to FIG. 5.

The NMOS transistor MN33 is a switching transistor, its drain is connected to sources of the NMOS transistors MN31 and MN32, its gate is connected to an enable signal EN, and its source is connected to a ground voltage VSS. The enable signal EN is activated when the semiconductor device receives a read command. In other words, the NMOS transistor MN33 is activated by the enable signal EN and may direct a predetermined amount of current from the input terminals IN and INB to the ground voltage VSS.

The bias circuit 32 activates and/or deactivates the bias signal on the output signal line BIAS in response to a control signal CNTL. The control signal CNTL may be defined as a signal generated by combination of a column selection signal and a latch instruction signal indicating the time of data latch. The configuration and operation of the bias circuit 32 will be discussed in detail below with respect to FIG. 5.

Now referring to FIG. 5, a circuit diagram of current sense amplifiers according to embodiments of the present invention, for example, the circuit shown in FIG. 4, will be discussed. The latch 30 may be implemented by two pair of NMOS transistors MN41 through MN44. For example, the drains and gates of a first pair of NMOS transistors MN41 and MN42 of the latch 30 are cross coupled, and the first pair of the NMOS transistors MN41 and MN42 have a latch structure in which the drains are connected to the drains of the NMOS transistors MN31 and MN32. The gates of the NMOS transistors MN41 and MN42 are connected to the output terminals OUTB and OUT, respectively. A second pair of NMOS transistors MN43 and MN44 are connected in series with the NMOS transistors MN41 and MN42. The output signal line BIAS is connected to the gates of MN41 and MN42, and their sources are connected to the drain of the NMOS transistor MN33. The NMOS transistors MN43 and MN44 may function as a resistance and thus, may be alternatively implemented by resistor instead of a NMOS transistor.

Figure 5:
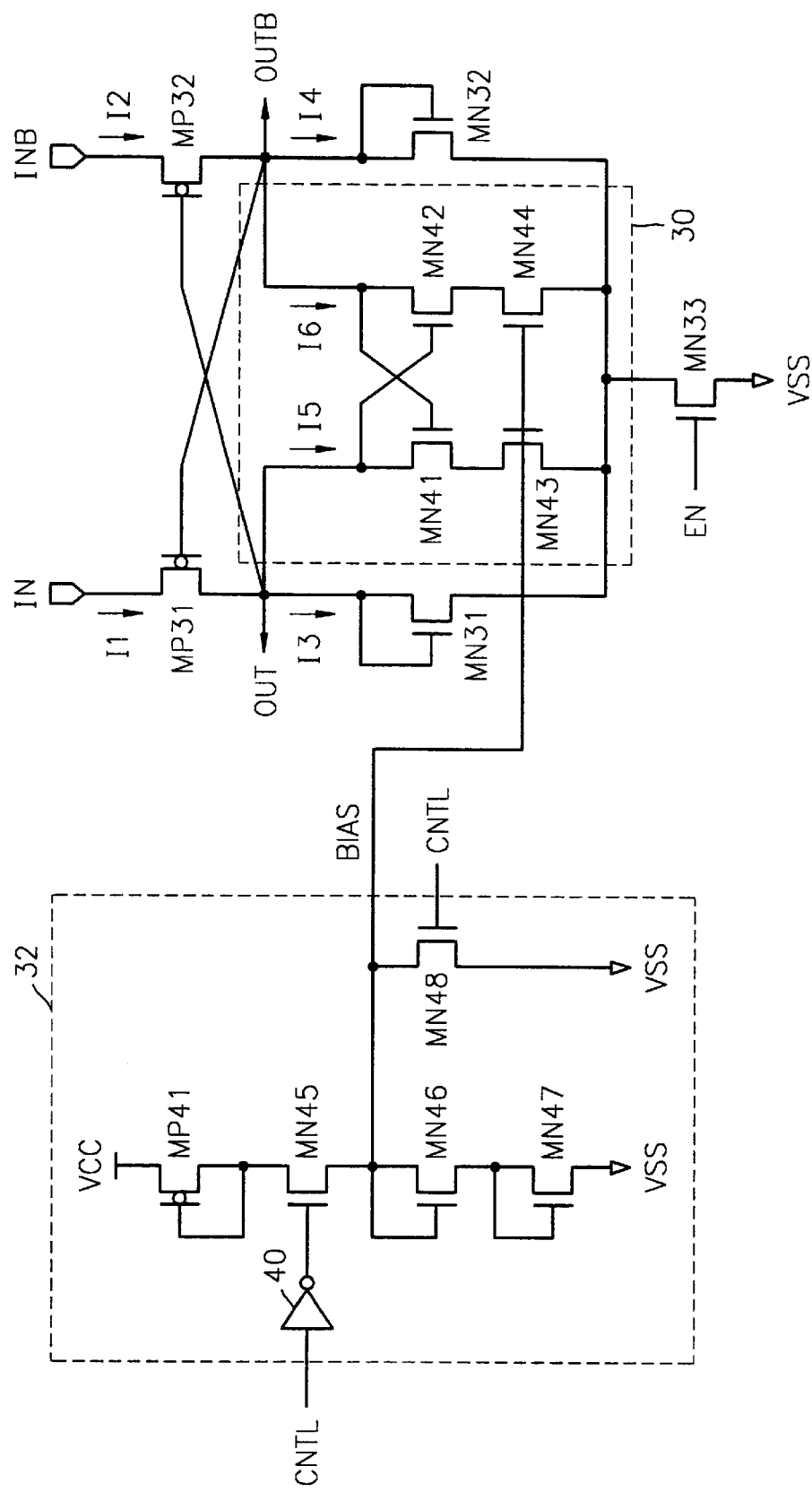
FIG. 5 is a detailed circuit diagram of a current sense amplifier circuit, for example, the circuit shown in FIG. 4.

It will be understood that although the latch 30 is described above as being implemented by two pair of NMOS transistors MN41 through MN44 as shown in FIG. 5, the invention should not be limited to this configuration. For example, the latch 30 may be implemented by a pair of NMOS transistors. Alternatively, the latch 30 may be implemented by a pair of PMOS transistors or multiple pairs of PMOS transistors. Furthermore, the latch 30 including the resistance component may be implemented by a combination of NMOS transistors, PMOS transistors and/or resistors.

The bias circuit 32 may include an inverter 40, a PMOS transistor MP41, and NMOS transistors MN45 through MN48. The inverter 40 inverts the control signal CNTL and outputs an inverted version of the control signal CNTL. A source of the PMOS transistor MP41 is connected to a power supply voltage VCC, and the PMOS transistor MP41 has a diode structure in which its gate and its drain are connected to the drain of the NMOS transistor MN45. A gate of the NMOS transistor MN45 is connected to output of the inverter 40, and a source of the NMOS transistor MN45 is connected to the output signal line BIAS. The NMOS transistors MN46 and MN47 are connected in a totem pole arrangement between the output signal line BIAS and the ground voltage VSS and have a diode structure in which their drains and gates are cross coupled. A gate of the NMOS transistor MN48 is connected to the control signal CNTL, and its drain is connected to the output signal line BIAS, and its source is connected to the ground voltage VSS. That is, the NMOS transistor MN48 is switched on and/or off in response to the control signal CNTL and activates and/or deactivates the output signal line BIAS.

Now referring to FIGS. 6(A) through 6(C), which are timing diagrams illustrating operations of current sense amplifier circuits according to embodiments of the present invention, for example, the circuit shown in FIG. 5, will be discussed. FIG. 6A illustrates currents input to the input terminals IN and INB, FIG. 6B illustrates the control signal CNTL, and FIG. 6C illustrates the output signal line BIAS.

The operation of the current sense amplifier circuit according to embodiments of the present invention will be described with reference to FIGS. 5 and 6(A) through 6(C). When a difference is sensed between currents I1 and I2, voltages of the output terminal OUT and the complementary output terminal OUTB may begin to vary. The switching transistor MN33 is turned on by the enable signal EN. The control signal CNTL (of FIG. 6B) may be applied to the bias circuit 32 at a time when data is input into the current sense amplifier, i.e. at a time when the input currents IN and INB are varied, as shown in FIG. 6A, and is set to a low level. Thus, the NMOS transistor MN45 of the bias circuit 32 of FIG. 5 is turned on, and the bias signal on the output signal line BIAS is set to a high level, as shown in FIG. 6C. When the bias signal on the output signal line BIAS is set to a logic high level, the latch 30, formed of a pair of NMOS transistors, operates. When the latch 30 operates, loads of the output terminals OUT and OUTB may be reduced, which may cause the output voltages VOUT and VOUTB to increase and/or decrease more rapidly.

For example, in a case where the current I1 applied to the input terminal IN is smaller than the current I2, the voltage of the output terminal OUT may be reduced relatively, and the voltage of the complementary output terminal OUTB may be increased. Thus, the voltage of the output terminal OUT may be reduced more rapidly by the latch 30. Similarly, the voltage of the complementary output terminal OUTB may be increased more rapidly by the latch 30. When the voltage of the output terminal OUT is low and the voltage of the complementary output terminal OUTB is high, a resistance value of the NMOS transistor 41 of the latch 30 may be reduced. As a result, a current I5 through the NMOS transistor MN41 may be increased more than a current I3 through the NMOS transistor MN31 causing the voltage of the output terminal OUT to decrease more quickly. The voltage of the output terminal OUT may be reduced even more when there is no latch 30, by a parallel resistance value of the NMOS transistor MN31 and resistance values of the NMOS transistors MN41 and MN43.

On the other hand, the resistance value of the NMOS transistor MN42 of the latch 30 may increase more by the reduced output voltage OUT. As a result, a current I6 through the NMOS transistor MN32 may be smaller than a current I4 through the NMOS transistor MN32, and the voltage of the complementary output terminal OUTB may be increased more quickly. The voltage of the complementary output terminal OUTB may be increased more than that in a case where there is no latch 30, by the parallel resistance values of the NMOS transistor MN32 and the NMOS transistors MN42 and MN44.

By way of further example, in a case where the current I1 is larger than the current I2, the voltage of the output terminal OUT may be increased, and the voltage of the complementary output terminal OUTB may be reduced. Other operations will be the same as described above. Similarly, amplification may be increased compared with a case in which there is no latch 30 included in the current sense amplifier. Accordingly, the latch 30 is connected in parallel with the NMOS transistors MN31 and MN32 and functions as a resistance. Loads of the output terminals OUT and OUTB may be reduced when the output voltages of OUT and OUTB vary, which may result in varying the output voltages more rapidly and an increased amplification gain of the current sense amplifier.

Furthermore, when the voltages of OUT and OUTB are constant and there is a significant difference between the output voltages OUT and OUTB in a state of full sensing, the control signal CNTL is set to a high level as shown in FIG. 6B. When the control signal CNTL is at a high level, the NMOS transistor MN45 of the bias circuit 32 is turned off, and the NMOS transistor MN48 is turned on. Thus, the bias signal on the output signal line BIAS generated from the bias circuit 32 is at a low level as shown in FIG. 6C. When the bias signal is at a low level, the latch 30 does not to operate. In other words, when there is a significant difference in voltages between the output terminal OUT and the complementary output terminal OUTB, the operation of the latch 30 is prevented. Accordingly, fast correspondence may be possible even in cases where the state of the next data input into the current sense amplifier is varied, and an operation speed may be improved.

In a case where the power supply voltage VCC is increased beyond a predetermined level, the control signal CNTL is set to a high level, and the bias signal on the output signal line BIAS is at a low level, thus, rendering the latch 30 inoperable. When the power supply voltage VCC rises, transconductances of the NMOS transistors of the latch 30 are increased, and stability may deteriorate. For example, in the case of the PMOS transistors MP31 and MP32, a current difference ΔI may be obtained using the following equations:

$$I1 = -g_{mp} * v_{outb} \quad (7)$$

$$I2 = -g_{mp} * v_{out} \quad (8)$$

$$\Delta I = I1 - I2 = g_{mp} (v_{out} - v_{outb}) \quad (9)$$

where I1 and I2 represent predetermined currents supplied from the pair of differential input/output lines IO and IOB, respectively, $g_{mp}$ represents the transconductance of PMOS transistors MP31 and MP32, $v_{out}$ represents the output voltage of output terminal OUT, voutb represents the output voltage of complementary output terminal OUTB, and ΔI represents the difference between first and second currents I1 and I2.

Furthermore, in the case of the NMOS transistors MN31 and MN32, a current difference ΔI2 may be obtained using the following equations:

$$I3 = g_{mn1} * v_{out} \quad (10)$$

$$I4 = g_{mn} * v_{outb} \quad (11)$$

$$\Delta I2 = I3 - I4 = g_{mn1} (v_{out} - v_{outb}) \quad (12)$$

where I3 and I4 represent currents through NMOS transistors MN31 and MN32, respectively, $g_{mn1}$ represents the transconductance of PMOS transistors MN31 and MN32, $v_{out}$ represents the output voltage of output terminal OUT, $v_{outb}$ represents the output voltage of complementary output terminal OUTB, and ΔI represents the difference between first and second currents I3 and I4.

Furthermore, in the case of the NMOS transistors MN41 and MN42, a current difference ΔI3 may be obtained using the following equations:

$$I5 = g_{mn2} * v_{outb} \quad (13)$$

$$I6 = g_{mn2} * v_{out} \quad (14)$$

$$\Delta I3 = I5 - I6 = -g_{mn2}(v_{out} - v_{outb}) \quad (15)$$

where I5 and I6 represent currents through NMOS transistors MN41 and MN42, respectively, $g_{n2}$ represents the transconductance of PMOS transistors MN41 and MN42, $v_{out}$ represents the output voltage of output terminal OUT, $v_{outb}$ represents the output voltage of complementary output terminal OUTB, and ΔI3 represents the difference between first and second currents I5 and I6.

Assuming that the current I1 is equal to the sum of the currents I3 and I5, and that the current I2 is equal to the sum of the currents I4 and I6, the currents I1 and I2 may be expressed by the following equations:

$$I1 = I3 + I5 \quad (16)$$

$$I2 = I4 + I6 \quad (17)$$

$$g_{mp} (v_{out} - v_{outb}) = (g_{mn1} - g_{mn2}) * (v_{out} - v_{outb}) \quad (18)$$

Thus, to provide stability in a semiconductor device, $g_{mp}$ should be smaller than $g_{mn1} - g_{mn2}$. In a case where the power supply voltage VCC is increased and the latch 30 operates, amplification is partially performed by internal transistors of the latch 30. Assuming that the bias signal on the output signal line BIAS is constant, the larger the power supply voltage VCC, the larger the transconductances, but a relative increase rate is expressed as $g_{mp} > g_{mn1} > g_{mp2}$. Thus, when the bias signal on the output signal line BIAS is constant, even though the power supply voltage VCC is increased, stability is increased. However, the bias signal on the output signal line BIAS may be increased by an increase in the power supply voltage VCC, and the transconductance $g_{mn2}$ may also be increased. Accordingly, in the present invention, in a case where the power supply voltage VCC is increased beyond a predetermined level, the bias signal on the output signal line BIAS is deactivated by the control signal CNTL and stability may not be reduced.

As described above, a latch is added to a current sense amplifier circuit, and operation of a latch is controlled by a bias signal. The latch may be activated and/or deactivated by the bias signal. Operation of the latch may provide a more stable semiconductor device and may further increase amplification of the current sense amplifier. The bias signal is not generated in a case where a high power supply voltage is applied, thereby improving stability. Further, the current sense amplifier circuit quickens correspondence of input data in a case where data input into the current sense amplifier is varied, thus, operation speed may be improved.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. A current sense amplifier, comprising:
   first and second sense transistors having cross-coupled gates and drains;
   first and second load devices having first terminals connected to respective drains of said first and second sense transistors;
   a latch having first and second inputs connected to respective drains of said first and second sense transistors;
   an enable device that is responsive to an enable signal and has a first terminal connected to second terminals of said first and second load devices and a first output of said latch; and
   a bias circuit that generates the bias signal on an output signal line in response to a control signal, wherein the bias circuit comprises:
      a first PMOS transistor having a source connected to a power supply voltage and a gate and a drain connected together;
      a first NMOS transistor responsive to the control signal having a drain connected to the gate and drain of the first PMOS transistor and a source connected to the output signal line;
      second and third NMOS transistors connected in a totem pole arrangement between the output signal line and a ground voltage and having cross coupled gates and drains in a diode structure; and
      a fourth NMOS transistor having a gate connected to the control signal, a drain connected to the output signal line and a source connected to the ground voltage.

2. The amplifier of claim 1, wherein said first and second load devices comprise first and second load transistors, respectively, that are connected as diodes.

3. The amplifier of claim 1, wherein said latch comprises first and second MOS transistors having cross-coupled drains and gates.

4. The amplifier of claim 3, wherein said latch is responsive to the bias signal.

5. A current sense amplifier, comprising:
   first and second sense transistors having cross-coupled gates and drains;
   first and second load devices having first terminals connected to respective drains of said first and second sense transistors;
   a latch having first and second inputs connected to respective drains of said first and second sense transistors;
   an enable device that is responsive to an enable signal and has a first terminal connected to second terminals of said first and second load devices and a first output of said latch; and
   a bias circuit that generates the bias signal on an output signal line in response to a control signal, wherein the control signal is generated in response to a column selection signal and a latch instruction signal that indicates the time of the latch.

6. A current sense amplifier, comprising:
   first and second sense transistors having cross-coupled gates and drains;
   first and second load devices having first terminals connected to respective drains of said first and second sense transistors;
   a latch having first and second inputs connected to respective drains of said first and second sense transistors;
   an enable device that is responsive to an enable signal and has a first terminal connected to second terminals of said first and second load devices and a first output of said latch; and
   a bias circuit that generates the bias signal on an output signal line in response to a control signal, wherein the bias signal is a logic high when the control signal is a logic low and wherein the bias signal is a logic low when the control signal is a logic high.

7. The amplifier of claim 6, wherein the latch is activated when the bias signal is at a logic high and wherein the latch is deactivated when the bias signal is at a logic low.

8. The amplifier of claim 6, wherein the control signal is a logic low when a pair of first and second output voltages vary.

9. The amplifier of claim 6, wherein the control signal is a logic high when the first and second output signals are constant and have different values.

10. The amplifier of claim 6, wherein the control signal is a logic high when a power supply voltage is increased beyond a predetermined level.

11. A current sense amplifier, comprising:
    first and second sense transistors having cross-coupled gates and drains;
    first and second load devices having first terminals connected to respective drains of said first and second sense transistors;
    a latch having first and second inputs connected to respective drains of said first and second sense transistors; and
    a bias circuit that generates a bias signal on an output signal line in response to a control signal, wherein the bias circuit comprises:
       a first PMOS transistor having a source connected to a power supply voltage and a gate and a drain connected together;
       a first NMOS transistor responsive to the control signal having a drain connected to the gate and drain of the first PMOS transistor and a source connected to the output signal line;
       second and third NMOS transistors connected in a totem pole arrangement between the output signal line and a ground voltage and having cross coupled gates and drains in a diode structure; and
       a fourth NMOS transistor having a gate connected to the control signal, a drain connected to the output signal line and a source connected to the ground voltage.

12. The amplifier of claim 11, further comprising an enable device that is responsive to an enable signal and has a first terminal connected to second terminals of said first and second load devices and a first output of said latch.

13. The amplifier of claim 12, wherein said first and second load devices comprise first and second load transistors, respectively, that are connected as diodes.

14. The amplifier of claim 12, wherein said latch comprises first and second MOS transistors having cross-coupled drains and gates.

15. The amplifier of claim 14, wherein said latch is responsive to the bias signal.

16. A current sense amplifier, comprising:
    first and second sense transistors having cross-coupled gates and drains;

first and second load devices having first terminals connected to respective drains of said first and second sense transistors;

a latch having first and second inputs connected to respective drains of said first and second sense transistors; and a bias circuit that generates a bias signal on an output signal line in response to a control signal, wherein the control signal is generated in response to a column selection signal and a latch instruction signal that indicates the time of the latch.

17. A current sense amplifier, comprising:

first and second sense transistors having cross-coupled gates and drains;

first and second load devices having first terminals connected to respective drains of said first and second sense transistors;

a latch having first and second inputs connected to respective drains of said first and second sense transistors; and a bias circuit that generates a bias signal on an output signal line in response to a control signal, wherein the bias signal is a logic high when the control signal is a logic low and wherein the bias signal is a logic low when the control signal is a logic high.

18. The amplifier of claim 17, wherein the latch is activated when the bias signal is at a logic high and wherein the latch is deactivated when the bias signal is at a logic low.

19. The amplifier of claim 17, wherein the control signal is a logic low when a pair of first and second output voltages vary.

20. The amplifier of claim 17, wherein the control signal is a logic high when the first and second output signals are constant and have different values.

21. The amplifier of claim 17, wherein the control signal is a logic high when a power supply voltage is increased beyond a predetermined level.

22. A current sense amplifier circuit for sensing and amplifying memory cell data received from data input/output line pairs, the current sense amplifier circuit comprising:

sense transistors having a latch structure in which the data input/output line pairs are connected to each source, and drains and gates are cross coupled, for inputting first and second currents from the data input/output line pairs and sensing a difference between the first current and the second current;

load transistors of which gates and drains are connected to drains of the sense transistors, respectively;

a switching transistor of which drain is connected to sources of the load transistors and gate is connected to a predetermined enabling signal, and the switching transistor is switched in response to the enabling signal; and a latch, which is connected in parallel with the load transistors, for forming another current path from the sense transistors in response to a predetermined bias signal, wherein the latch comprises:

a first pair of NMOS transistors having a latch structure in which drains and gates are cross coupled, and each drain is connected to each drain of the load transistors; and a pair of resistive elements, which are connected in series with the first pair of NMOS transistors, respectively and controlled by the bias signal.

23. The current sense amplifier circuit according to claim 22, wherein the latch is implemented by at least a pair of NMOS transistors.

24. The current sense amplifier circuit according to claim 22, wherein the pair of resistive elements are implemented by a second pair of NMOS transistors of which drains are connected to each source of the first pair of NMOS transistors, and gates are connected to the bias signal.

25. The current sense amplifier circuit according to claim 22, wherein the latch is implemented by at least a pair of PMOS transistors.

26. A current sense amplifier circuit for sensing and amplifying memory cell data received from data input/output line pairs, the current sense amplifier circuit comprising:

sense transistors having a latch structure in which the data input/output line pairs are connected to each source, and drains and gates are cross coupled, for inputting first and second currents from the data input/output line pairs and sensing a difference between the first current and the second current;

load transistors of which gates and drains are connected to drains of the sense transistors, respectively;

a switching transistor of which drain is connected to sources of the load transistors and gate is connected to a predetermined enabling signal, and the switching transistor is switched in response to the enabling signal; and a latch, which is connected in parallel with the load transistors, for forming another current path from the sense transistors in response to a predetermined bias signal, wherein the bias signal is activated at an interval where voltages of output terminal and an inversion output terminal are varying, which are connected to the drains of the sense transistors, respectively, and the bias signal is deactivated when the voltages of the output terminal and the inversion output terminal are constant.

27. A current sense amplifier circuit for sensing and amplifying memory cell data received from data input/output line pairs, the current sense amplifier circuit comprising:

sense transistors having a latch structure in which the data input/output line pairs are connected to each source, and drains and gates are cross coupled, for inputting first and second currents from the data input/output line pairs and sensing a difference between the first current and the second current;

load transistors of which gates and drains are connected to drains of the sense transistors, respectively;

a switching transistor of which drain is connected to sources of the load transistors and gate is connected to a predetermined enabling signal, and the switching transistor is switched in response to the enabling signal; and a latch, which is connected in parallel with the load transistors, for forming another current path from the sense transistors in response to a predetermined bias signal, wherein the bias signal is deactivated when a power supply voltage is increased beyond a predetermined level.

28. A current sense amplifier circuit for sensing and amplifying memory cell data received from data input/output line pairs, the current sense amplifier circuit comprising:

sense transistors having a latch structure in which the data input/output line pairs are connected to each source, and drains and gates are cross coupled, for inputting first and second currents from the data input/output line pairs and sensing a difference between the first current and the second current;

load transistors of which gates and drains are connected to drains of the sense transistors, respectively;

a switching transist of which drain is connected to sources of the load transistors and gate is connected to a predetermined enabling signal, and the switching transistor is switched in response to the enabling signal;

a latch, which is connected in parallel with the load transistors, for forming another current path from the sense transistors in response to a predetermined bias signal; and a bias circuit for activating/deactivating the bias signal in response to a predetermined control signal.

29. The current sense amplifier circuit according to claim 28, wherein the latch is implemented by at least a pair of NMOS transistors.

30. The current sense amplifier circuit according to claim 28, wherein the latch comprises:

a first pair of NMOS transistors having a latch structure in which drains and gates are cross coupled, and each drain is connected to each drain of the load transistors; and a pair of resistive elements, which are connected in series with the first pair of NMOS transistors, respectively and controlled by the bias signal.

31. The current sense amplifier circuit according to claim 28, wherein the pair of resistive elements are implemented by a second pair of NMOS transistors of which drains are connected to each source of the first pair of NMOS transistors, and gates are connected to the bias signal.

32. The current sense amplifier circuit according to claim 28, wherein the latch is implemented by at least a pair of PMOS transistors.

33. The current sense amplifier circuit according to claim 28, wherein the bias circuit is activated during an interval when voltages of an output terminal and an inversion output terminal are varying, which are connected to the drains of the sense transistors, and the bias signal is deactivated when the voltages of the output terminal and the inversion output terminal are constant.

34. The current sense amplifier circuit according to claim 28, wherein the bias circuit is deactivated when a power supply voltage is increased beyond a predetermined level.

* * * * *

UNITED STATES PATENT AND TRADEMARK OFFICE
CERTIFICATE OF CORRECTION

PATENT NO.    : 6,483,353 B2 Page 1 of 1
DATED         : November 19, 2002
INVENTOR(S)   : Kim et al.

It is certified that error appears in the above-identified patent and that said Letters Patent is hereby corrected as shown below:

Column 13,
Line 3, should read as follows:
-- a switching transistor of which drain is connected to sources --

Signed and Sealed this

Twenty-eighth Day of December, 2004

JON W. DUDAS
*Director of the United States Patent and Trademark Office*